United States Patent
Borodulin et al.

(10) Patent No.: US 6,188,277 B1
(45) Date of Patent: Feb. 13, 2001

(54) POWER AMPLIFIER HAVING MONITORING AND CIRCUIT PROTECTION

(75) Inventors: Dmitriy Borodulin; Zhiqun Hu, both of Quincy, IL (US); Peter J. Poggi, Webster, NY (US); George Cabrera; Timothy W. Dittmer, both of Quincy, IL (US); Bryce A. Robertson, Payson, IL (US)

(73) Assignee: Harris Corporation, Melbourne, FL (US)

( * ) Notice: Under 35 U.S.C. 154(b), the term of this patent shall be extended for 0 days.

(21) Appl. No.: 09/137,643

(22) Filed: Aug. 19, 1998

(51) Int. Cl.$^7$ ....................................... H03F 1/52
(52) U.S. Cl. .................. 330/51; 330/107; 330/124 D; 330/207 P
(58) Field of Search ................................ 330/51, 124 R, 330/124 D, 129, 136, 207 P, 107; 455/115, 117, 126

(56) References Cited

U.S. PATENT DOCUMENTS

| | | | |
|---|---|---|---|
| 4,794,343 | * 12/1988 | Yang | 330/124 R |
| 4,859,967 | * 8/1989 | Swanson | 330/207 P |
| 5,111,166 | 5/1992 | Plonka et al. | 333/128 |
| 5,121,077 | * 6/1992 | McGann | 330/107 X |
| 5,126,704 | 6/1992 | Dittmer et al. | 333/125 |
| 5,157,346 | * 10/1992 | Powell et al. | 330/107 X |
| 5,256,987 | * 10/1993 | Kibayashi et al. | 330/51 X |
| 5,438,683 | * 8/1995 | Durtler et al. | 330/129 X |
| 5,884,143 | * 3/1999 | Walkstein et al. | 330/107 X |

* cited by examiner

Primary Examiner—Steven J. Mottola
(74) Attorney, Agent, or Firm—Tarolli, Sundheim, Covell, Tummino & Szabo L.L.P.

(57) ABSTRACT

A power amplifier system is presented for amplifying an RF input signal. The system includes a vector modulator for receiving and modifying an input signal and providing therefrom a modified signal. The system also includes at least one power amplifier the operation of which is monitored and the vector modulator is controlled in accordance with the monitoring.

85 Claims, 6 Drawing Sheets

POWER AMPLIFIER HAVING MONITORING AND CIRCUIT PROTECTION

TECHNICAL FIELD

The present invention is generally directed to an RF power amplifier system for use in amplifying an RF input signal and is more particularly directed toward monitoring the system and providing protection for the system.

BACKGROUND OF THE INVENTION

RF power amplifier systems are known in the art for use in amplifying RF signals for broadcasting purposes including radio and television. Such power amplifiers may be employed in the broadcasting of either analog television signals, known as the NTSC, PAL, SECAM format, or digital signals, sometimes known as DTV format. When employed in television broadcasting, the frequency bandwidth for the television signals is 6 MHz. The television channels will be in the UHF signal range from approximately 470 to 860 MHz.

The RF input signal to such a power amplifier is obtained from an RF exciter and, for example, this may take the form of a modulated RF carrier within a frequency band of 470 to 860 MHz with the bandwidth of any one channel being on the order of 6 MHz. This modulated RF input signal may have a magnitude on the order of 20 milliwatts. This input signal is increased in magnitude to a much higher level such as on the order of 400 watts which represents a gain on the order of 43 dB.

These power amplifier systems are expected in many situations to be constantly operating so that a radio or television station employing such a power amplifier system may continuously broadcast.

SUMMARY OF THE INVENTION

In accordance with one aspect of the present invention, the power amplifier system for amplifying an RF input signal includes a modulator, such as a vector modulator, for receiving and modifying an input signal and providing therefrom a modified signal. The system includes at least one power amplifier the operation of which is monitored and the modulator is controlled in accordance with the monitoring.

In accordance with a more limited aspect of the present invention, the vector modulator includes a gain varying means for varying the gain of the input signal in response to the monitored operation of the power amplifier.

In accordance with a still further aspect of the present invention, the modulator includes signal phase varying means for varying the phase of the input signal in response to the monitoring of the operation of the system.

Also, in accordance with another aspect of the present invention, a power detector detects the RMS power of the input signal and compares this with a reference and the operation of the amplifying system is adjusted in accordance with that comparison.

In accordance with a still further aspect of the present invention, the average input power is determined and compared to the average output power and the modulator is adjusted in accordance with that comparison.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein.

DESCRIPTION OF A PREFERRED EMBODIMENT

Figure 1:
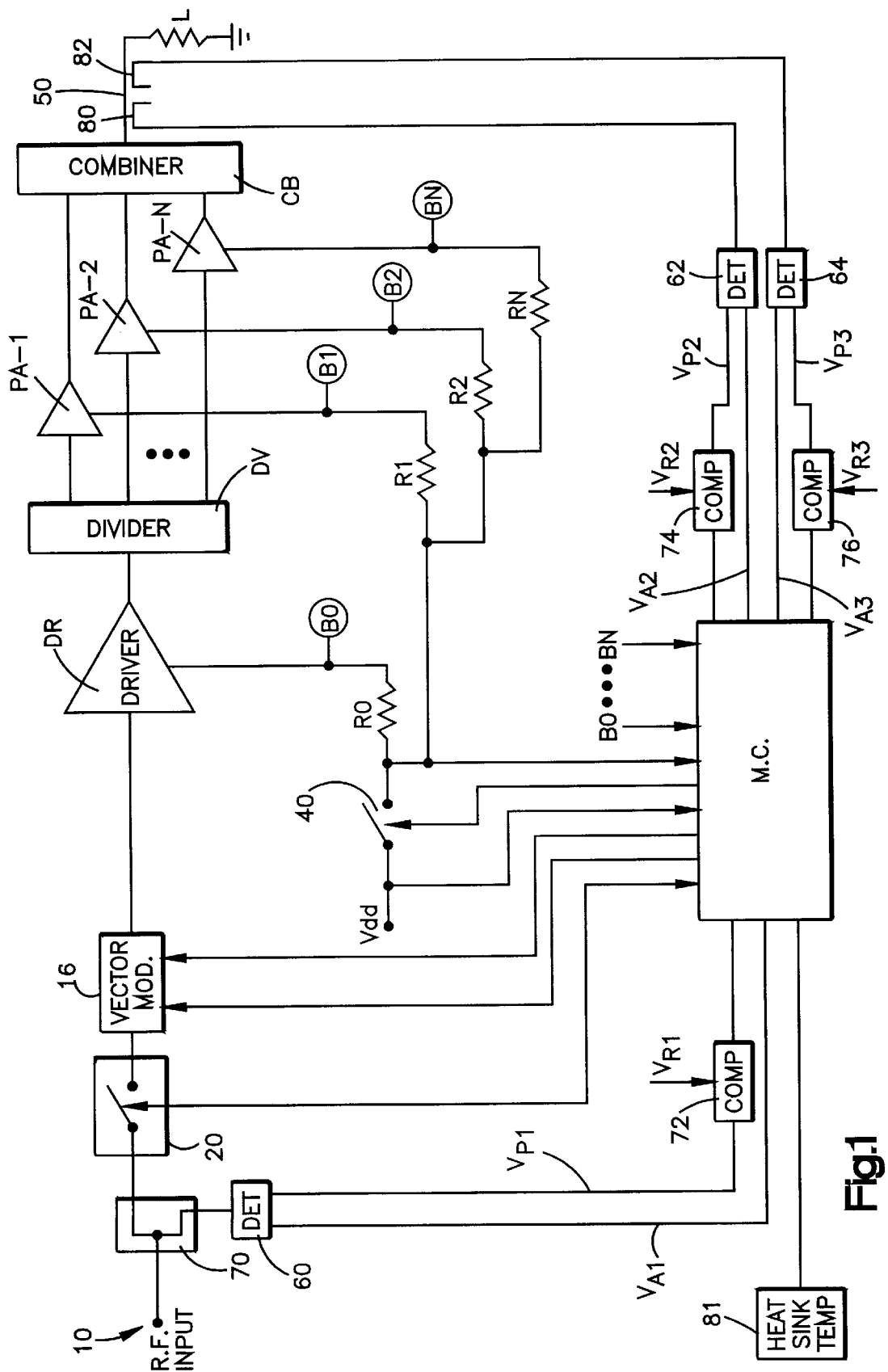
FIG. 1 is a schematic-block diagram illustration of apparatus employed in one embodiment of the invention.

Reference is now made to FIG. 1 which illustrates a power amplifier module or system which receives a modulated RF input signal at an input terminal 10 and amplifies the signal and supplies it to a load L, which may take the form of a transmitting antenna and associated equipment. As an example only, the RF input signal may have a magnitude on the order of 20 milliwatts and have a frequency within the UHF frequency range between 470 and 860 MHz with a 6 MHz bandwidth for the television channel involved. The signal may be increased by the amplifier with a gain on the order of 43 dB so that the output signal as applied to the load L may be on the order of 400 watts.

The RF input signal is applied to the input terminal 10 and, thence, to a vector modulator. The vector modulator changes the magnitude and the phase of the RF signal. The modified RF signal from the vector modulator is then amplified by a driver DR to a higher level, such as 20 watts. The output, as taken from the driver DR, is then supplied to a power divider DV, sometimes referred to as a signal or power splitter, which divides the amplified signal by a factor of N. N signals are then applied to N power amplifiers PA-1 through PA-N, where N, for example, may be 12. The signals from the power amplifiers PA-1 through PA-N are then combined in a signal combiner CB to provide an output signal which is applied to the load L.

The input signal is applied to a vector modulator 16 when the RF input switch 20 is closed. The RF switch 20 is controlled by a microcontroller MC, as will be explained in greater detail hereinafter. The microcontroller also controls the vector modulator to vary the phase and gain of the RF signal.

The driver DR amplifies the signal with a gain of approximately 14 dB to deliver an RF signal of approximately 20 watts to a divider DV. This divider serves as a power splitter and splits the applied RF signal into N portions. The divider applies N equal portions of the RF signal to respective power amplifiers PA-1 through PA-N. Each power amplifier includes a field effect transistor having its drain electrode connected through a suitable resistor, such as resistor R1 or R2 or RN, to a DC switch 40. When this switch is closed, it connects each drain electrode with a DC voltage source $V_{DD}$. This voltage source may, for example, be on the order of 32 volts.

The outputs from the power amplifiers PA-1 through PA-N are combined at the power combiner CB. The output signal at the output circuit 50 is on the order of 400 watts.

The microcontroller MC monitors the operation of the amplifier system and controls the system by varying the phase and or gain of the RF signal and controlling the operation of the RF switch 20 and the DC switch 40.

When the DC switch 40 is closed, current will flow in the power amplifiers PA-1 through PA-N. This current will flow through the associated resistors R1 through RN. A voltage is developed across each resistor. These voltages are supplied as current samples to the microprocessor MC which then determines whether the current levels are too high or too low and takes appropriate action. Also, when the switch 40 is closed current flows through resistor R0 and the driver DR. The voltage developed across this resistor is also supplied to the microcontroller MC for analysis.

In addition to monitoring the current flowing through the various power amplifiers, the microcontroller also monitors peak and average power levels with the use of power detectors. These detectors include an input power detector 60 and output power detectors 62 and 64. The power detector 60 is connected to an input signal divider 70 and serves to provide DC output signals $V_{P1}$ and $V_{A1}$ respectively representative of the input peak power and the input average power. The signal representative of the input peak power $V_{P1}$ is compared with a reference $V_{R1}$ at comparator 72. If the peak power $V_{P1}$ exceeds the reference then an interrupt signal is supplied to the microprocessor MC which interrupts the routine being processed and enters a fault process to turn the power amplifier system off.

Detector 62 is connected to a incident signal coupler 80 coupled to the output transmission line 50. This detector 62 provides a DC voltage signal $V_{P2}$ representative of the peak output power as well as a DC voltage $V_{A2}$ which represents the average output power in the forward direction at the output transmission line 50. Signal $V_{P2}$ is compared with a reference $V_{R2}$ at comparator 74. If signal $V_{P2}$ exceeds reference $V_{R2}$ then an interrupt signal is supplied to microcontroller MC which then enters a fault process routine to turn the power amplifier off.

A coupler 82 is employed for sensing the reflected power and this coupler is connected to detector 64. This detector 64 serves to provide DC voltage signals including a signal $V_{P3}$ representative of the peak reflected power and $V_{A3}$ representative of the average reflected power. If signal $V_{P3}$ exceeds a reference $V_{R3}$, then comparator 76 applies an interrupt signal to the microcontroller MC which then enters a fault process routine to turn the power amplifier off. The monitored average power signals $V_{A1}$, $V_{A2}$ and $V_{A3}$ are supplied to the microcontroller MC which is programmed to vary the gain and/or phase of the RF signal as needed.

POWER DETECTOR

Figure 2:
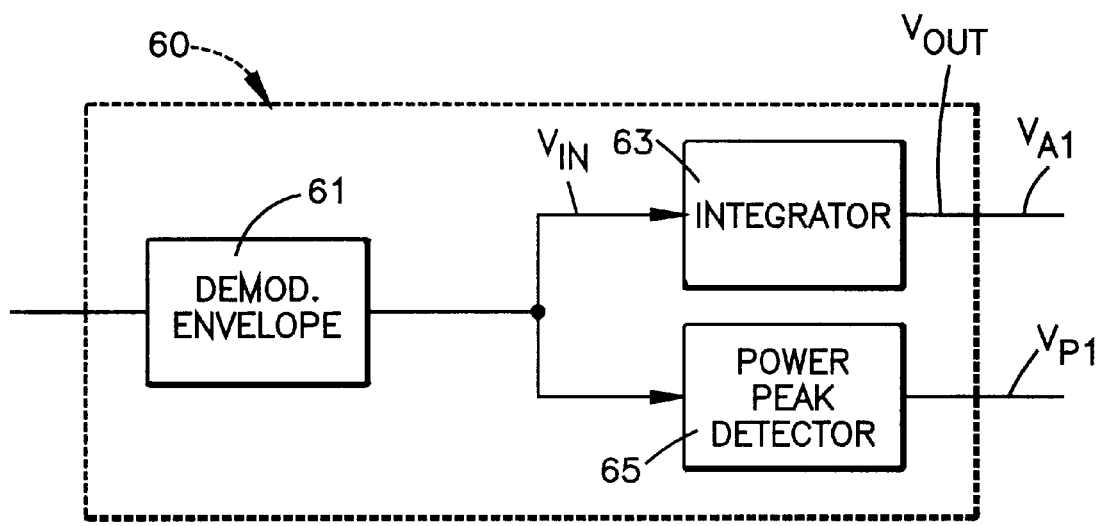
FIG. 2 is a block diagram of a detector in accordance with the invention.

Each of the power detectors is constructed in the same fashion as detector 60 which is described in detail with reference to FIG. 2. This detector includes an envelope demodulator 61 which receives a sample of an RF signal from correspondingly input or output transmission lines. The carrier signal may, for example, be on the order of 600 MHz and the baseband for the television signal has a bandwidth of 6 MHz. The demodulator 61 effectively strips off the carrier signal (600 MHz) leaving only the demodulated baseband signal. This signal may be viewed as an analog positive signal and which is applied to the integrator 63 and a peak power detector 65.

The integrator 63 provides an output signal in the form of voltage $V_{A1}$ representative of the average input power whereas the peak detector 65 provides an output signal in the form of a voltage $V_{P1}$ representative of the peak input power. The demodulator 61 and the integrator 63 form an RMS detector.

Integrator

Figure 3:
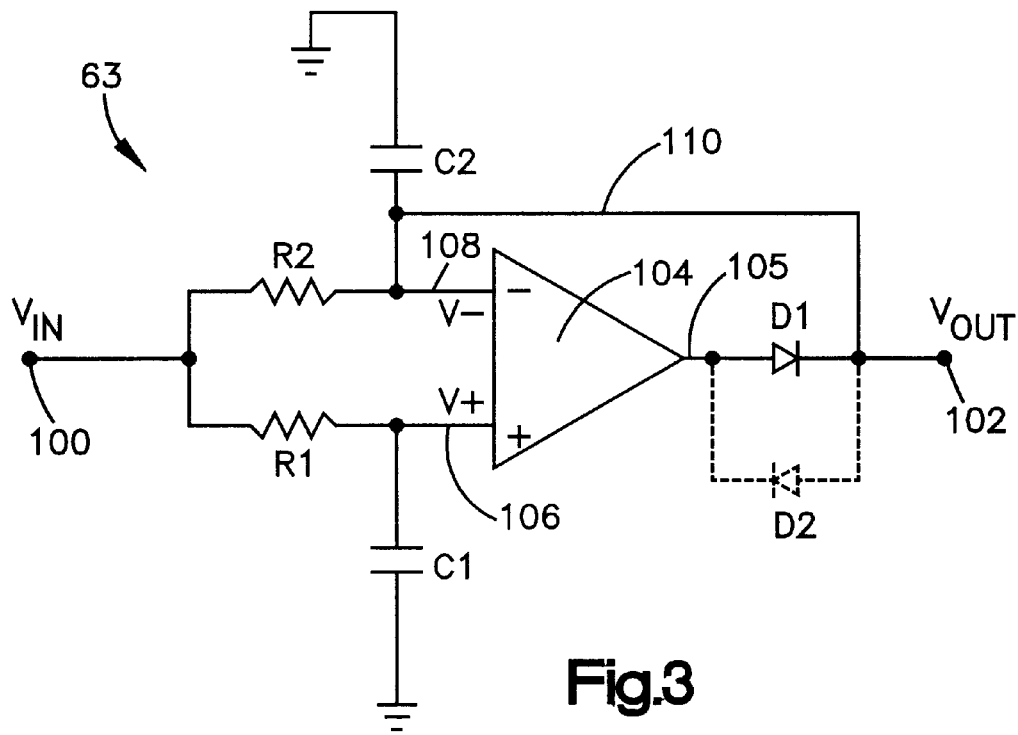
FIG. 3 is a schematic-block diagram of an integrator in accordance with the invention.

The integrator 63 located in each of the detectors 60, 62 and 64 may take the form as illustrated in FIG. 3 to be described below.

As will be recalled, the digital 8-VSB format refers to an 8 level vestigial sideband signal. The baseband of this signal is 6 MHz wide. It is desired to provide efficient power level control of the power amplifier system illustrated in FIG. 1. To achieve this, it is desirous to provide a power detector that provides an output signal, $V_{out}$, which is proportional to the corresponding average power. In the past, circuit designers have typically employed true RMS detectors for converting an input baseband signal into a DC level proportional to the RMS power. This is done in accordance with the equation noted below.

$$V_{RMS} = \frac{\sqrt{\int^T V_{in}^2 dt}}{T}$$

A significant problem in a power amplifier system as shown in FIG. 1 is the complexity and expense of the circuitry to perform the above equation. At present, commercially available integrated circuits that perform this type of an equation are only suitable for use at low frequencies, such as up to 10 kHz. As such, they are not able to provide an RMS signal representative of a baseband signal that is of a substantially higher frequency, such as being 6 MHz wide as in the case of digital television signals. There is a need to provide a circuit that will deliver an output voltage $V_{out}$ which is proportional to the RMS value of the input voltage $V_{in}$ without employing multiplication (such as $V_{in}$ times $V_{in}$ to obtain $V_{in}^2$). This is achieved with the circuit shown in FIG. 3 as described below.

The input voltage $V_{in}$ is applied to an input terminal 100 and the output voltage $V_{out}$ is obtained at an output terminal 102. A wideband operational amplifier 104 is provided having an RC charge path connected to its positive or non-inverting input 106 and an RC discharge path is connected to its inverting or negative input 108. The charge path includes a resistor R1 and a capacitor C1 having their junction point connected to input 106 of amplifier 104. The other side of capacitor C1 is connected to circuit ground. The discharge path includes a resistor R2 and a capacitor C2 having their junction point connected to input 108 of the operational amplifier 104. The other side of capacitor C2 is connected to circuit ground. A diode D1 is connected between the output 105 of amplifier 104 and the circuit output 102. The circuit output 102 is connected to the negative input 108 of the amplifier 104 by way of a circuit path 110.

The circuit in FIG. 3 has separate RC circuits that define the charge and discharge time constants and thereby provides independently controlled charge and discharge times. The circuit may be tuned by changing the value of resistors R1 and R2 so that the ratio of the charge and discharge time constants allows the detector to deliver an output voltage $V_{out}$ proportional to the RMS value of $V_{in}$. The manner of operation involved is presented below.

Consider a situation wherein the diode D1 is connected between output 105 and circuit output 102 and that R2*C2≧R1*C1.

In this situation, the voltages $V_{out}$ and V− will follow voltage V+ as voltage V+ increases. The moment voltage V+ decreases, voltage $V_{out}$ follows the discharge time $R2*C2$ until V+ increases again and the operation repeats. Since voltage V+ follows voltage $V_{in}$ with a charge time constant $R1*C1$, then voltage $V_{out}$ follows voltage $V_{in}$ with the $C1*R1$ time constant on the rise and the $C2*R2$ time constant on the voltage $V_{in}$ fall.

When the $R2*C2$ time constant is long enough $$\left(\frac{1}{C2*R2} < f_{low}\right)$$

where $f_{low}$ is the lowest frequency in the spectrum of the envelope demodulated signal) this allows creation of the voltage $V_{out}$ anywhere in the range from voltage $V_{in}$ max. to voltage $V_{in}$ average by manipulating the $C1*R1$ time constant from $C1*R1=0$ to $C1*R1=C2*R2$.

If the diode D1 is replaced by diode D2 (as shown by the broken line) the condition $R1*C1 \geq R2*C2$ results. If $R1*C1$ is long enough $$\left(\frac{1}{C1*R1} < f_{low}\right)$$

then this allows creation of voltage $V_{out}$ anywhere in the range from $V_{in}$ average to $V_{in}$ minimum, varying $C2*R2$ from=$C1*R1$ to zero.

In the power amplifier system of FIG. 1, it is contemplated that an 8-VSB baseband signal is involved. It's spectrum looks like white noise with a frequency range from 0 to 6 MHz and almost even distribution of power within the range. The goal is to tune the ratio of charge and discharge time constants for the detector to deliver voltage $V_{out}$ proportional to the RMS value of voltage $V_{in}$ without going through a multiplication ($V_{in}*V_{in}$), which would require circuit complication.

This is achieved by referencing voltage $V_{out}$ originated by 8-VSB modulated RF to voltage $V_{out}$ originated by CW. Since the modulation baseband of the nonmodulated (CW) RF signal is equal to zero, voltage $V_{in}$ is a DC voltage. The RMS value for the DC voltage is equal to the voltage itself. Applied as voltage $V_{in}$, it will appear as $V_{out}=V_{in}$ on the output of the detector. The level of this voltage $V_{out}$ can be used as a reference of RMS voltage for a given average power of RF and, after switching from CW to 8-VSB signal with the same average power level, tune the time constants so that the voltage $V_{out}$ shows the same value.

The way to tune the time constants is to adjust the values of resistors R1 and R2 to achieve a certain voltage $V_{out}$. Thus, the RMS detector delivers true RMS value for two kinds of RF modulations: CW (no modulation) and 8-VSB.

Another explanation that may be employed for understanding the circuitry of FIG. 3 is now presented. A non-modulated continuous wave (CW) signal of a known power level Pr may be applied to the RF input terminal 10 (see FIG. 1). The value of voltage $V_{out}$ is observed. The continuous wave may then be replaced with an 8-VSB source of the same known power level $P_r$. Again, the output voltage $V_{out}$ is observed. Since the input power levels were the same $P_r$, the value of voltage $V_{out}$ should be the same for both cases. If it is not the same, then the values of resistor R1 and R2 in the charge and discharge paths, are varied to change the ratio of the charge and discharge time constants. Once the output voltages are the same then the values of the resistors are fixed and thus they have been optimized to achieve the same voltage $V_{out}$ for both CW and 8-VSB baseband signals.

Flow Diagrams

Reference is now made to the flow diagrams of FIG. 4 through FIG. 9 which illustrate the manner in which the microcontroller MC is programmed to accomplish various functions herein.

Figure 4:
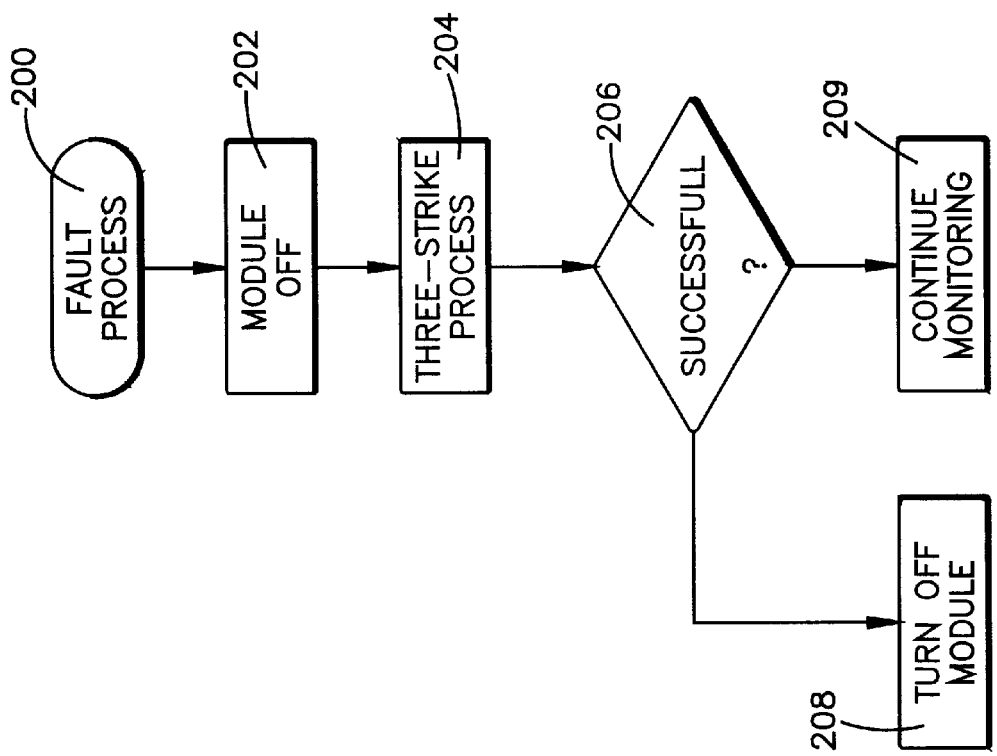
FIG. 4 is a flow diagram of one routine involved in the invention.

Attention is specifically directed to FIG. 4 which illustrates the flow diagram for the fault process routine 200 which is employed for turning off the power amplifier when a fault condition has been determined. In step 202, a "module off" indication has been made because a condition (to be discussed in greater detail hereinafter) has been determined to be a fault and the module (i.e. the power amplifier of FIG. 1) is to be turned off. This may be accomplished by the microcontroller MC controlling the RF switch 20 and the DC switch 40 by opening the switches and by adjusting the modulator 16 for minimum gain.

The procedure then steps to a three-strike process 204 during which the power amplifier is turned on and the conditions are again monitored to determine if there is a fault condition. In this case, the power amplifier is turned on up to three times over a 10 second interval to determine whether the fault condition is still present.

Thereafter, the procedure advances to step 206 which determines whether the power amplifier has been successfully turned on during the three-strike process. If it has been successful, then the procedure advances to step 209 and continues monitoring. If the attempt to restart the power amplifier is not successful, then the procedure advances to step 208 during which the power amplifier is shut down and not restarted. This shut down procedure involves the microcontroller commanding the RF switch 20 to open and commanding the DC switch 40 to open as well as turning down the gain of the vector modulator 16.

Figure 5:
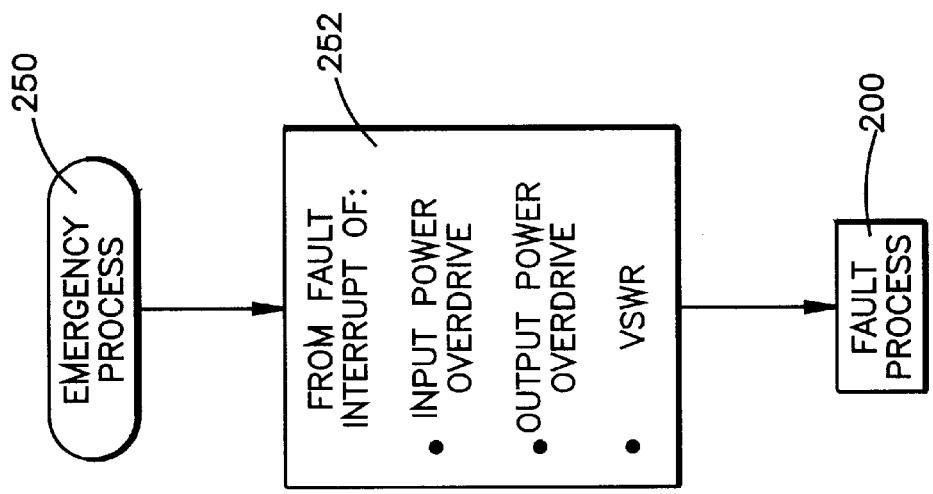
FIG. 5 is a flow diagram of another routine involved in the invention.

Reference is now made to FIG. 5 which illustrates an emergency process routine 250 which is employed by the microcontroller in the event that emergency level faults have been detected. This routine includes step 252 during which the microcontroller responds to an interrupt signal received from one of the peak power comparators 72, 74 or 76 to interrupt the microcontroller and enter into the fault process routine 200, described above with reference to FIG. 4, for purposes of turning off the power amplifier module of FIG. 1. As will be recalled, comparator 72 provides such an interrupt signal when the input peak power signal $V_{P1}$ is greater than a reference signal $V_{R1}$. Similarly, comparator 74 provides such an interrupt signal when the output forward peak power signal $V_{P2}$ exceeds a reference $V_{R2}$. Also comparator 76 provides such an interrupt signal when the reflected peak power signal $V_{P3}$ exceeds a reference $V_{R3}$ (representative of a VSWR excessive condition).

Figure 6:
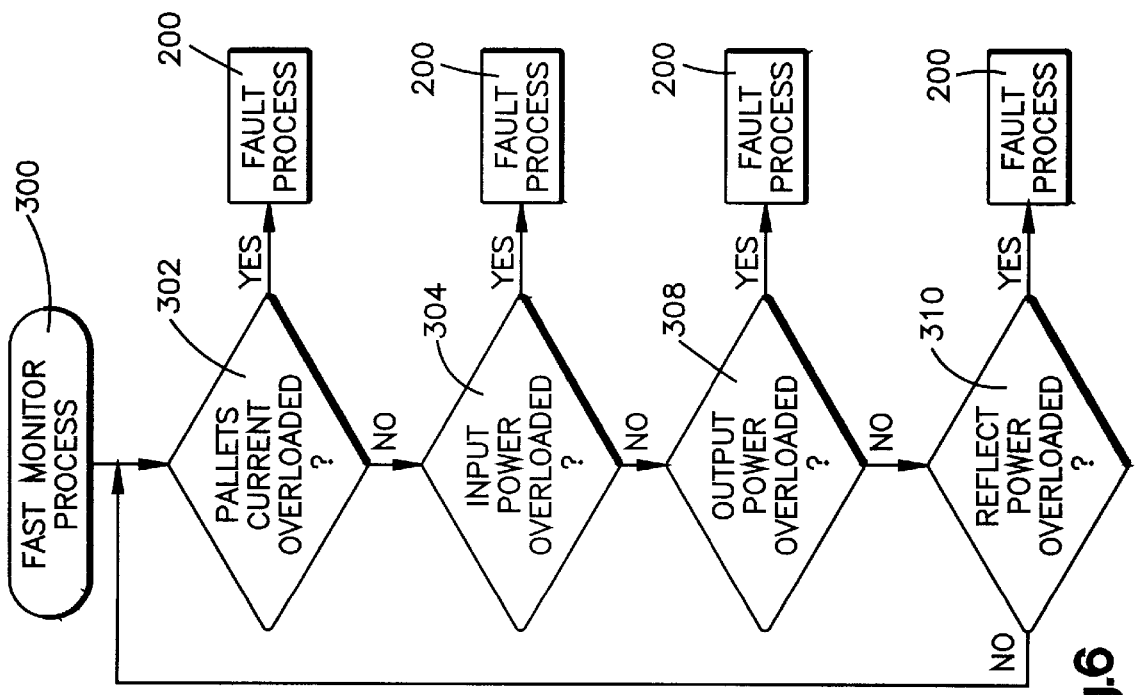
FIG. 6 is a flow diagram of another routine involved in the invention.

Reference is now made to FIG. 6 which illustrates a fast monitor process routine 300. In this routine, a determination is made at step 302 as to whether any of the pallets or power amplifiers PA-1 through PA-N have an overloaded current condition. If so, then the procedure advances to the fault process 200 (see FIG. 4). If not, the procedure advances to step 304.

Figure 7:
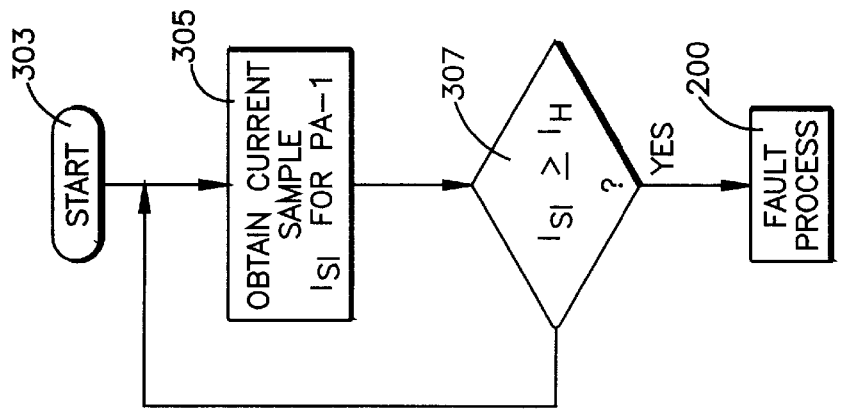
FIG. 7 is a flow diagram of another routine involved in the invention.

Before proceeding with step 304 attention is now directed to FIG. 7 which illustrates a routine for determining whether one of the power amplifiers PA-1 through PA-N has an over-current condition. This routine commences with a start step 303 and, in the monitoring operation, a current sample $I_{S1}$ representative of the current flowing in the power amplifier PA-1 is obtained in step 305. In step 307, the current sample $I_{S1}$ is compared with a reference sample $I_H$ representative of a high level of acceptance. If the current sample exceeds this high level, the procedure advances to the fault process 200 discussed hereinbefore with reference to FIG. 4. This type of routine may be practiced for monitoring each of the power amplifiers PA-1 through PA-N.

Attention is again directed to routine 300 in FIG. 6. If none of the power amplifiers are current overloaded, as determined in step 302, the procedure advances to step 304 wherein a determination is made as to whether the input power is overloaded. In this step, a signal representative of the average input power is signal $V_{A1}$ and this is compared with a reference of an acceptable level in the microcontroller MC. If an overload condition is determined, the procedure advances to the fault process 200.

If the input power is not overloaded, the procedure advances to step 308 at which a determination is made as to whether the output power is overloaded. This is accomplished by comparing the signal $V_{A2}$, representative of the average output power, with an acceptable reference level. If signal $V_{A2}$ exceeds the reference level, the procedure advances to the fault process routine 200. If not, then the procedure advances to step 310.

In step 310 a determination is made as to whether the reflected power is overloaded. This is determined by comparing the average reflected power signal $V_{A3}$ with a reference level and if the reflected power is overloaded, the procedure advances to the fault process routine 200.

Figure 8:
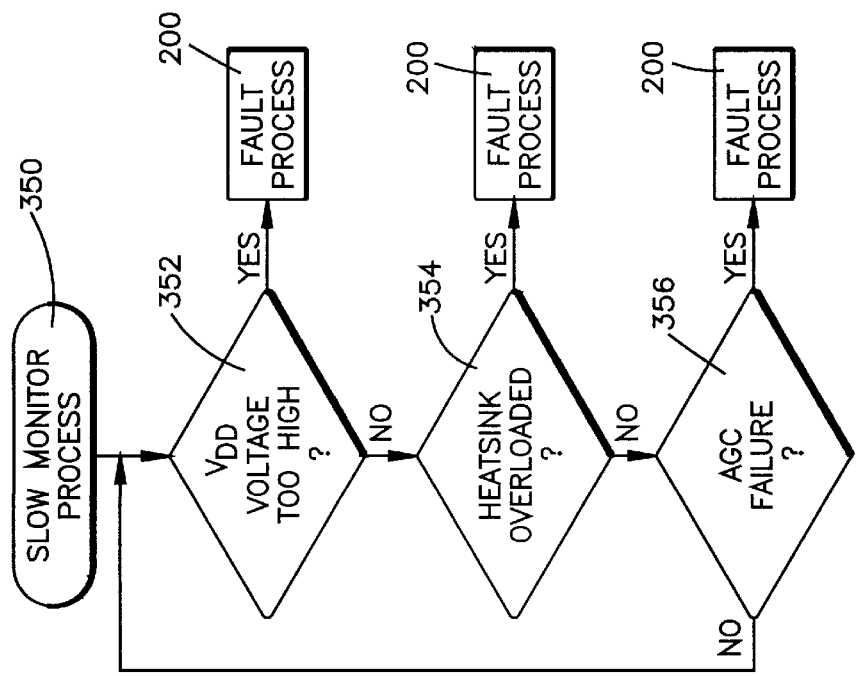
FIG. 8 is a flow diagram of another routine involved in the invention.

Reference is now made to FIG. 8 which illustrates a slow monitor process routine 350. In this routine, a determination is made at step 352 as to whether the DC voltage ($V_{DD}$) is too high. This is accomplished by comparing the voltage with a reference level. If the voltage $V_{DD}$ is too high, the procedure advances to the fault process 200. If not, the procedure advances to step 354.

In step 354, a determination is made as to whether the heat sink temperature is too high. This is obtained by comparing a signal representative of the heat sink temperature from a suitable source 81 with a reference. If the heat sink is overloaded, the procedure advances to the fault process routine 200. Otherwise, the procedure advances to step 356.

In step 356, a determination is made as to whether there has been an automatic gain control failure (AGC failure). If so, the procedure advances to the fault process routine 200. Otherwise, the monitoring operation continues.

Figure 9A:
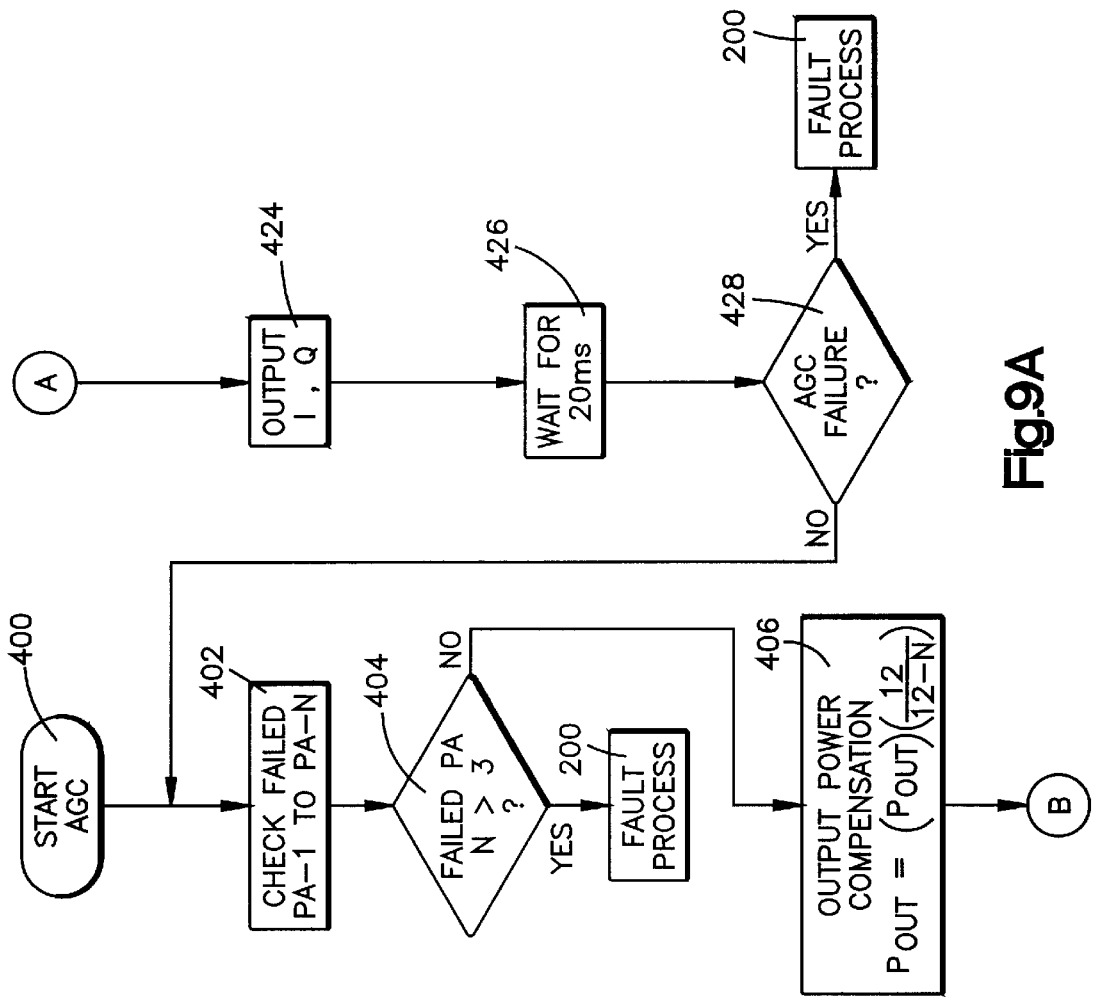
FIG. 9 is a flow diagram of another routine involved in the invention.
Figure 9B:
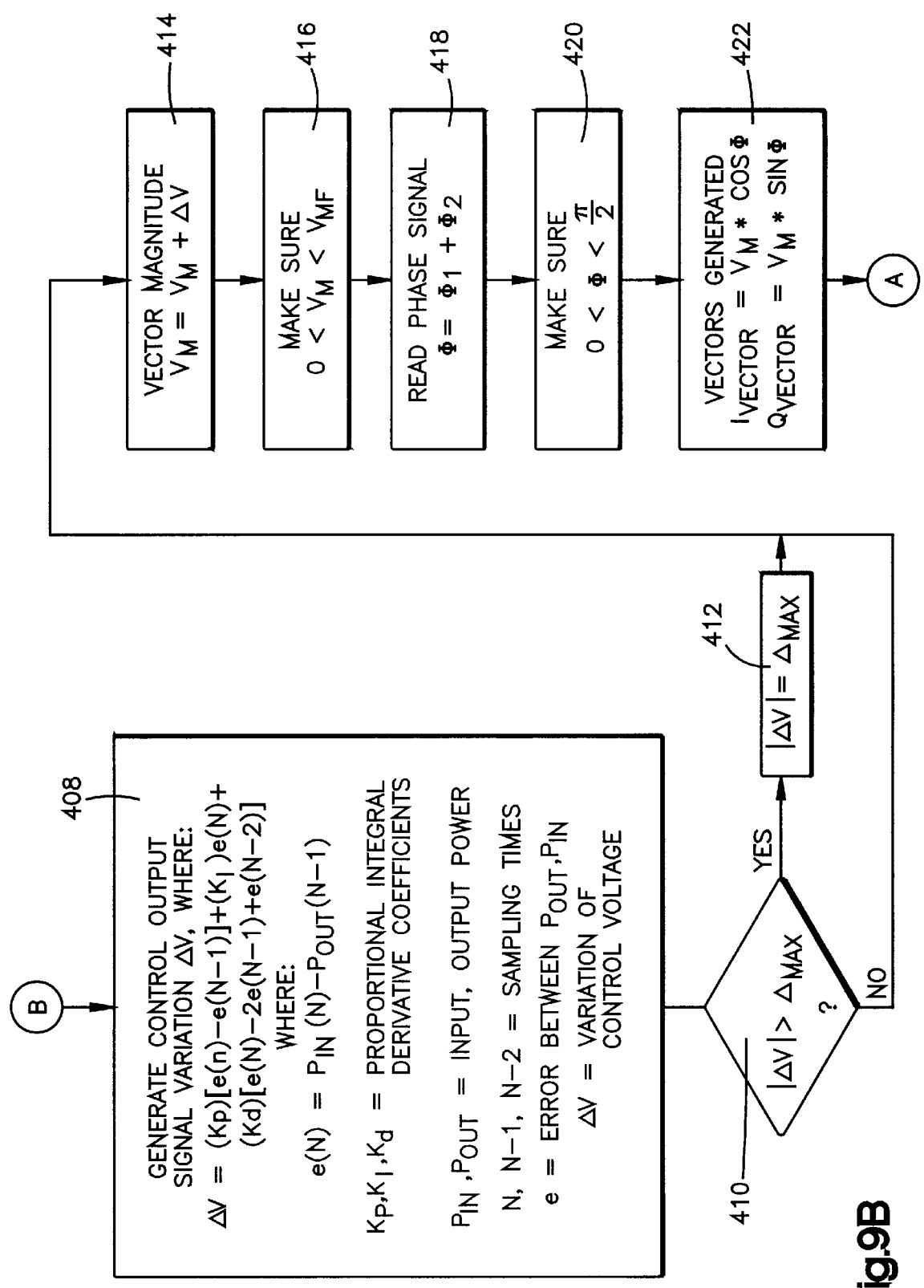

Reference is now made to FIG. 9 which illustrates the automatic gain control (AGC) routine 400. This procedure includes step 402 during which a check is made as to whether any of the power amplifiers PA-1 through PA-N have failed and the procedure advances to step 404 at which a determination is made as to whether the number (N) of failed power amplifiers exceeds 3(i.e. is N>3?). If yes, the procedure advances to the fault process routine 200. If not, then output power compensation is determined wherein the output power sample $P_{out}$ (corresponding with the representative signal $V_{P2}$) is re-calculated by multiplying the measured value of the output power by the ratio of $$\frac{12}{12-N}.$$

In this example, the total number of power amplifiers is 12 and if no power amplifiers have failed then the new value of the power output is equal to the old value. However, if some of the power amplifiers have failed, then a new calculation can be made in accordance with the step 406 to determine value of the output power.

Thereafter the procedure advances to step 408. In this step, the control output signal variation $\Delta V$ is generated as presented in the block bearing the label 408.

The procedure then advances to step 410 at which a determination is made as to whether the absolute value of $\Delta V$ is greater than $\Delta_{MAX}$ (i.e. is $|\Delta V| > \Delta_{MAX}$). If so, the absolute value of $\Delta V$ (i.e. $|\Delta V|$) is made equal to the value of $\Delta_{MAX}$ in step 412.

The procedure then advances to step 414 wherein the vector magnitude of the control voltage vector $\Delta_{MAX}$ is updated so that it is equal to $\Delta_{MAX} + \Delta V$.

The procedure then advances to step 416 wherein a check is made that the control voltage vector $V_M$ is greater than 0 but is less than the full scale value of $V_M$ which is used herein as $V_{MF}$.

The procedure then advances to step 418 wherein the microcomputer reads the phase signals which are referred to as $\phi_1$ and $\phi_2$ from the external source 83 (FIG. 1). These signals are used in the following. The procedure advances to step 420 wherein a determination is made that $\phi$ is greater than 0 but less than $$\frac{\pi}{2} \quad \left(\text{i.e. } 0 < \phi < \frac{\pi}{2}\right).$$

The procedure then advances to step 422 wherein the vectors to be supplied to the vector modulator 16 are generated. This includes the $I_{vector}$ which is equal to $V_M \cos\phi$ and the $Q_{vector}$ which is equal to $V_M \sin\phi$.

The procedure now advances to step 424 wherein the $I_{vector}$ and the $Q_{vector}$ are supplied to the vector modulator 16 to vary the phase and gain of the signal being processed by the vector modulator 16.

Thereafter, the procedure advances to step 426 during which a suitable time, such as 20 milliseconds, is waited. Then, the procedure advances to step 428 during which a determination is made as to whether or not the AGC control has failed. If so, the procedure advances to the fault process procedure 200 (see FIG. 4).

In summation, the automatic gain control procedure 400 serves to protect or control the operation of the power amplifier module (power amplifier system of FIG. 1) by determining how many of the power amplifiers PA-1 through PA-N have failed. If more than three have failed, the power amplifier system is shut down by employing the fault process routine 200 (FIG. 4). However, if a lesser number of power amplifiers have failed the vector modulator 16 is controlled by the $I_{vector}$ and $Q_{vector}$ control signals to adjust the phase and gain of the signal being processed.

Although the invention has been described in conjunction with a preferred embodiment, it is to be appreciated that various modifications may be made without departing from the spirit and scope of the invention as defined by the appended claims.

From the above description of the invention, those skilled in the art will perceive improvements, changes and modifications in the invention. Such improvements, changes and modifications within the skill of the art are intended to be covered by the appended claims.

What is claimed is:

1. A power amplifier system for use in amplifying an RF input signal comprising:

signal modulating means for receiving and modifying an input signal and providing therefrom a modified first signal;

first switching means for, when closed, supplying said input signal to said modulating means;

at least one power amplifier to receive and amplify said modified first signal;

second switching means for, when closed, applying a DC voltage source to said power amplifier; and, means for monitoring the operation of said power amplifier and controlling said signal modulating means and said first and second switching means in accordance therewith.

2. A system as set forth in claim 1 wherein said signal modulating means varies the gain of said input signal and said monitoring and control means includes means for applying a gain control signal to said modulating means for controlling the gain of said input signal.

3. A power amplifier system for use in amplifying an RF input signal comprising:
- signal modulating means for receiving and modifying an input signal and providing therefrom a modified first signal;
- first switching means for, when closed, supplying said input signal to said modulating means;
- at least one power amplifier to receive and amplify said modified first signal;
- second switching means for, when closed, applying a DC voltage source to said power amplifier;
- means for monitoring the operation of said power amplifier and controlling said signal modulating means and said first and second switching means in accordance therewith, and
- wherein said modulating means varies the phase of said input signal and wherein said monitoring and controlling means includes means for applying a phase control signal to said modulating means for varying the phase of said input signal.

4. A power amplifier system for use in amplifying an RF input signal comprising:
- signal modulating means for receiving and modifying an input signal and providing therefrom a modified first signal;
- first switching means for, when closed, supplying said input signal to said modulating means;
- at least one power amplifier to receive and amplify said modified first signal;
- second switching means for, when closed, applying a DC voltage source to said power amplifier;
- means for monitoring the operation of said power amplifier and controlling said signal modulating means and said first and second switching means in accordance therewith; and
- wherein said modulating means is a vector modulator for varying the phase and gain of said input signal in response to phase and gain control signals.

5. A system as set forth in claim 4 wherein said monitoring and controlling means applies phase and gain control signals to said vector modulator.

6. A power amplifier system for use in amplifying an RF input signal comprising:
- signal modulating means for receiving and modifying an input signal and providing therefrom a modified first signal;
- first switching means for, when closed, supplying said input signal to said modulating means;
- at least one power amplifier to receive and amplify said modified first signal;
- second switching means for, when closed, applying a DC voltage source to said power amplifier;
- means for monitoring the operation of said power amplifier and controlling said signal modulating means and said first and second switching means in accordance therewith;
- first power detector means for detecting said input signal and providing therefrom an average input power signal representative of the average input power thereof, and
- a second power detector means connected to the output of said amplifier for providing an output average power signal representative of the average output power thereof; and,
- wherein said monitoring and controlling means includes means for comparing said input and output average power signals and controlling said modulating means in accordance therewith.

7. A power amplifier system for use in amplifying an RF input signal comprising:
- signal modulating means for receiving and modifying an input signal and providing therefrom a modified first signal;
- first switching means for, when closed, supplying said input signal to said modulating means;
- at least one power amplifier to receive and amplify said modified first signal;
- second switching means for, when closed, applying a DC voltage source to said power amplifier;
- means for monitoring the operation of said power amplifier and controlling said signal modulating means and said first and second switching means in accordance therewith; and
- detector means for detecting said input signal and providing a first peak power signal representative of the peak power level of said input signal, means for comparing said first peak power signal with a first reference signal and providing a first fault signal in accordance therewith, said monitoring and control means including means responsive to said first fault signal for controlling said amplifier in accordance therewith.

8. A system as set forth in claim 7 wherein said monitoring and control means controls said system by turning said amplifier off in response to said first fault signal.

9. A power amplifier system for use in amplifying an RF input signal comprising:
- signal modulating means for receiving and modifying an input signal and providing therefrom a modified first signal;
- first switching means for, when closed, supplying said input signal to said modulating means;
- at least one power amplifier to receive and amplify said modified first signal;
- second switching means for, when closed, applying a DC voltage source to said power amplifier;
- means for monitoring the operation of said power amplifier and controlling said signal modulating means and said first and second switching means in accordance therewith; and
- detector means for detecting the output power of said amplifier and providing a second peak power signal representative of the peak power value of said output signal, means for comparing said second peak power signal with a second reference signal and providing a second fault signal in accordance therewith, said monitoring and control means including means responsive to said second fault signal for controlling said system in accordance therewith.

10. A system as set forth in claim 9 wherein said monitoring and control means controls said system by turning said amplifier off in response to said second fault signal.

11. A power amplifier system for use in amplifying an RF input signal comprising:
- signal modulating means for receiving and modifying an input signal and providing therefrom a modified first signal;

first switching means for, when closed, supplying said input signal to said modulating means;

at least one power amplifier to receive and amplify said modified first signal;

second switching means for, when closed, applying a DC voltage source to said power amplifier;

means for monitoring the operation of said power amplifier and controlling said signal modulating means and said first and second switching means in accordance therewith; and detector means for detecting the reflected output power from a load associated with said amplifier and providing a third peak power signal representative of the peak power level of said reflected power, means for comparing said third peak power signal with a third reference signal and providing a third fault signal in accordance therewith, said monitoring and control means including means responsive to said third fault signal for controlling said system in accordance therewith.

12. A system as set forth in claim 11 wherein said control means controls said system by turning said amplifier off in response to said third fault signal.

13. A power amplifier system for use in amplifying an RF input signal comprising:

signal modulating means for receiving and modifying an input signal and providing therefrom a modified first signal;

first switching means for, when closed, supplying said input signal to said modulating means;

at least one power amplifier to receive and amplify said modified first signal;

second switching means for, when closed, applying a DC voltage source to said power amplifier;

means for monitoring the operation of said power amplifier and controlling said signal modulating means and said first and second switching means in accordance therewith; and means for monitoring the operation of said power amplifier system and providing a fault signal in response to detecting a fault condition, and means responsive to said fault signal for turning said amplifier off and for thereafter turning said amplifier on and then repeating said turning off and turning on of said amplifier a plurality of times over a given time interval to determine if the detected fault condition continues after repeated turning off and turning on of said system and if so, then turning said amplifier off without turning it on again.

14. A system as set forth in claim 13 wherein said detected fault condition is a condition wherein said power amplifier has an overloaded current condition.

15. A system as set forth in claim 13 wherein said detected fault condition is a condition wherein said input power to said power amplifier is overloaded.

16. A system as set forth in claim 13 wherein the detected fault condition is a condition wherein said output power is overloaded.

17. A system as set forth in claim 13 wherein said detected fault condition is a condition wherein the reflected power from a load associated with said amplifier is overloaded.

18. A system as set forth in claim 13 wherein said detected fault condition is a condition wherein said DC voltage source is too high.

19. A system as set forth in claim 13 wherein said detected fault condition is a condition wherein a heat sink associated with said amplifier is overloaded.

20. A system as set forth in claim 13 wherein said fault condition is a condition wherein an automatic gain control associated with said power amplifier is overloaded.

21. A power amplifier system for use in amplifying an RF input signal comprising:

signal modulating means for receiving and modifying an input signal and providing therefrom a modified first signal;

first switching means for, when closed, supplying said input signal to said modulating means;

N power amplifiers;

divider means for dividing said first signal into N signals for respective application to said N power amplifiers to provide N amplified signals;

second switching means for, when closed, applying a DC voltage source to each of said N power amplifiers;

means for combining said N amplified signals to provide therefrom an amplified output signal for application to an output circuit; and, means for monitoring the operation of said N power amplifiers and controlling said signal modulating means and said first and second switching means in accordance therewith.

22. A system as set forth in claim 21 wherein said signal modulating means varies the gain of said input signal and said monitoring and control means includes means for applying a gain control signal to said modulating means for controlling the gain of said input signal.

23. A system as set forth in claim 21 wherein said modulating means varies the phase of said input signal and wherein said monitoring and controlling means includes means for applying a phase control signal to said modulating means for varying the phase of said input signal.

24. A system as set forth in claim 21 wherein said modulating means is a vector modulator for varying the phase and gain of said input signal in response to phase and gain control signals.

25. A system as set forth in claim 24 wherein said monitoring and controlling means applies phase and gain control signals to said vector modulator.

26. A system as set forth in claim 21 including first power detector means for detecting said input signal and providing therefrom an average input power signal representative of the average input power thereof, and a second power detector means connected to the output of said amplifier for providing an output average power signal representative of the average output power thereof; and, wherein said monitoring and controlling means includes means for comparing said input and output average power signals and controlling said modulating means in accordance therewith.

27. A system as set forth in claim 21 including detector means for detecting said input signal and providing a first peak power signal representative of the peak power level of said input signal, means for comparing said first peak power signal with a first reference signal and providing a first fault signal in accordance therewith, said monitoring and control means including means responsive to said first fault signal for controlling said amplifier in accordance therewith.

28. A system as set forth in claim 27 wherein said monitoring and control means control said system by turning said amplifier off in response to said first fault signal.

29. A system as set forth in claim 21 including detector means for detecting the output power of said amplifier and providing a second peak power signal representative of the peak power value of said output signal, means for comparing said second peak power signal with a second reference signal and providing a second fault signal in accordance therewith, said monitoring and control means including means responsive to said second fault signal for controlling said system in accordance therewith.

30. A system as set forth in claim 29 wherein said monitoring and control means control said system by turning said amplifier off in response to said second fault signal.

31. A system as set forth in claim 21 including detector means for detecting the reflected output power from a load associated with said amplifier and providing a third peak power signal representative of the peak power level of said reflected power, means for comparing said third peak power signal with a third reference signal and providing a third fault signal in accordance therewith, said monitoring and control means including means responsive to said third fault signal for controlling said system in accordance therewith.

32. A system as set forth in claim 31 wherein said control means controls said system by turning said amplifier off in response to said third fault signal.

33. A system as set forth in claim 21 including means for monitoring the operation of said power amplifier system and providing a fault signal in response to detecting a fault condition, and means responsive to said fault signal for turning said amplifier off and for thereafter turning said amplifier on and then repeating said turning off and turning on of said amplifier a plurality of times over a given time interval to determine if the detected fault condition continues after repeated turning off and turning on of said system and if so, then turning said amplifier off without turning it on again.

34. A system as set forth in claim 33 wherein said detected fault condition is a condition wherein said power amplifier has an overloaded current condition.

35. A system as set forth in claim 33 wherein said detected fault condition is a condition wherein said input power to said power amplifier is overloaded.

36. A system as set forth in claim 33 wherein the detected fault condition is a condition wherein said output power is overloaded.

37. A system as set forth in claim 33 wherein said detected fault condition is a condition wherein the reflected power from a load is associated with said amplifier is overloaded.

38. A system as set forth in claim 33 wherein said detected fault condition is a condition wherein said DC voltage source is too high.

39. A system as set forth in claim 33 wherein said detected fault condition is a condition wherein a heat sink associated with said amplifier is overloaded.

40. A system as set forth in claim 33 wherein said fault condition is a condition wherein an automatic gain control associated with said power amplifier is overloaded.

41. A system as set forth in claim 33 wherein said detected fault condition is that more than a given number of said power amplifiers have failed.

42. A system as set forth in claim 41 wherein said modulator is a vector modulator and wherein said monitoring and control means apply signals to said modulator to vary the phase and gain of said input signal when at least one power amplifier has failed but less than said given number of power amplifiers have failed.

43. A power amplifier system for use in amplifying an RF input signal comprising:

signal modulating means for receiving and modifying an input signal and providing therefrom a modified first signal;

at least one power amplifier for receiving and amplifying said modified first signal;

means for monitoring the operation of said power amplifier and controlling said signal modulating means in accordance therewith;

first power detector means for detecting said input signal and providing therefrom an average input power signal representative of the average input power thereof, and a second power detector means connected to the output of said amplifier for providing an output average power signal representative of the average output power thereof; and, wherein said monitoring and controlling means includes means for comparing said input and output average power signals and controlling said modulating means in accordance therewith.

44. A power amplifier system for use in amplifying an RF input signal comprising:

signal modulating means for receiving and modifying an input signal and providing therefrom a modified first signal;

at least one power amplifier for receiving and amplifying said modified first signal;

means for monitoring the operation of said power amplifier and controlling said signal modulating means in accordance therewith; and, detector means for detecting said input signal and providing a first peak power signal representative of the peak power level of said input signal, means for comparing said first peak power signal with a first reference signal and providing a first fault signal in accordance therewith, said monitoring and control means including means responsive to said first fault signal for controlling said amplifier in accordance therewith.

45. A system as set forth in claim 44 wherein said monitoring and control means controls said system by turning said amplifier off in response to said first fault signal.

46. A power amplifier system for use in amplifying an RF input signal comprising:

signal modulating means for receiving and modifying an input signal and providing therefrom a modified first signal;

at least one power amplifier for receiving and amplifying said modified first signal;

means for monitoring the operation of said power amplifier and controlling said signal modulating means in accordance therewith; and, detector means for detecting the output power of said amplifier and providing a second peak power signal representative of the peak power value of said output power, means for comparing said second peak power signal with a second reference signal and providing a second fault signal in accordance therewith, said monitoring and control means including means responsive to said second fault signal for controlling said system in accordance therewith.

47. A system as set forth in claim 46 wherein said monitoring and control means controls said system by turning said amplifier off in response to said second fault signal.

48. A power amplifier system for use in amplifying an RF input signal comprising:

signal modulating means for receiving and modifying an input signal and providing therefrom a modified first signal;

at least one power amplifier for receiving and amplifying said modified first signal;

means for monitoring the operation of said power amplifier and controlling said signal modulating means in accordance therewith; and, detector means for detecting the reflected output power from a load associated with said amplifier and providing a third peak power signal representative of the peak power level of said reflected power, means for comparing said third peak power signal with a third reference signal and providing a third fault signal in accordance therewith, said monitoring and control means including means responsive to said third fault signal for controlling said system in accordance therewith.

49. A system as set forth in claim 48 wherein said control means controls said system by turning said amplifier off in response to said third fault signal.

50. A power amplifier system for use in amplifying an RF input signal comprising:

signal modulating means for receiving and modifying an input signal and providing therefrom a modified first signal;

N power amplifiers;

divider means for dividing said first signal into N signals for respective application to said N power amplifiers to provide N amplified signals;

means for combining said N amplified signals to provide therefrom an amplified output signal for application to an output circuit;

means for monitoring the operation of said N power amplifiers and controlling said signal modulating means in accordance therewith; and, said modulating means is a vector modulator for varying the phase and gain of said input signal in response to phase and gain control signals.

51. A system as set forth in claim 50 wherein said monitoring and controlling means applies phase and gain control signals to said vector modulator.

52. A power amplifier system for use in amplifying an RF input signal comprising:

signal modulating means for receiving and modifying an input signal and providing therefrom a modified first signal;

N power amplifiers;

divider means for dividing said first signal into N signals for respective application to said N power amplifiers to provide N amplified signals;

means for combining said N amplified signals to provide therefrom an amplified output signal for application to an output circuit;

means for monitoring the operation of said N power amplifiers and controlling said signal modulating means in accordance therewith;

first power detector means for detecting said input signal and providing therefrom an average input power signal representative of the average input power thereof, and a second power detector means connected to the output of said amplifier for providing an output average power signal representative of the average output power thereof; and, wherein said monitoring and controlling means includes means for comparing said input and output average power signals and controlling said modulating means in accordance therewith.

53. A power amplifier system for use in amplifying an RF input signal comprising:

signal modulating means for receiving and modifying an input signal and providing therefrom a modified first signal;

N power amplifiers;

divider means for dividing said first signal into N signals for respective application to said N power amplifiers to provide N amplified signals;

means for combining said N amplified signals to provide therefrom an amplified output signal for application to an output circuit;

means for monitoring the operation of said N power amplifiers and controlling said signal modulating means in accordance therewith; and, detector means for detecting said input signal and providing a first peak power signal representative of the peak power level of said input signal, means for comparing said first peak power signal with a first reference signal and providing a first fault signal in accordance therewith, said monitoring and control means including means responsive to said first fault signal for controlling said amplifier in accordance therewith.

54. A system as set forth in claim 53 wherein said monitoring and control means control said system by turning said amplifier off in response to said first fault signal.

55. A power amplifier system for use in amplifying an RF input signal comprising:

signal modulating means for receiving and modifying an input signal and providing therefrom a modified first signal;

N power amplifiers;

divider means for dividing said first signal into N signals for respective application to said N power amplifiers to provide N amplified signals;

means for combining said N amplified signals to provide therefrom an amplified output signal for application to an output circuit;

means for monitoring the operation of said N power amplifiers and controlling said signal modulating means in accordance therewith; and, detector means for detecting the output power of said amplifier and providing a second peak power signal representative of the peak power value of said output power, means for comparing said second peak power signal with a second reference signal and providing a second fault signal in accordance therewith, said monitoring and control means including means responsive to said second fault signal for controlling said system in accordance therewith.

56. A system as set forth in claim 55 wherein said monitoring and control means control said system by turning said amplifier off in response to said second fault signal.

57. A power amplifier system for use in amplifying an RF input signal comprising:

signal modulating means for receiving and modifying an input signal and providing therefrom a modified first signal;

N power amplifiers;

divider means for dividing said first signal into N signals for respective application to said N power amplifiers to provide N amplified signals;

means for combining said N amplified signals to provide therefrom an amplified output signal for application to an output circuit;

means for monitoring the operation of said N power amplifiers and controlling said signal modulating means in accordance therewith; and, detector means for detecting the reflected output power from a load associated with said amplifier and providing a third peak power signal representative of the peak power level of said reflected power, means for comparing said third peak power signal with a third reference signal and providing a third fault signal in accordance therewith, said monitoring and control means including means responsive to said third fault signal for controlling said system in accordance therewith.

58. A system as set forth in claim 57 wherein said control means controls said system by turning said amplifier off in response to said third fault signal.

59. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith.

60. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith; and said signal modulator varies the phase of said input signal and wherein monitor-controller applies a phase control signal to said modulator thereby varying the phase of said input signal.

61. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith; and wherein said signal modulator is a vector modulator which varies the phase and gain of said input signal in response to phase and gain control signals.

62. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith;

first power detector which detects said input signal and provides therefrom an average input power signal representative of the average input power thereof, and a second power detector connected to the output of said amplifier for providing an output average power signal representative of the average output power thereof; and wherein said monitor-controller includes a comparator the compares said input and output average power signals and controls said modulator in accordance therewith.

63. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith; and a detector that detects said input signal and provides a first peak power signal representative of the peak power level of said input signal, a comparator that compares said first peak power signal with a first reference signal and provides a first fault signal in accordance therewith, said monitor-controller responds to said first fault signal and controls said amplifier in accordance therewith.

64. A power amplifier system for use in amplifying an RF input signal comprising:

a signal modulator which receives and modifies an input signal and provides therefrom a modified first signal;

a first switch having a closed condition to supply said input signal to said modulator;

at least one power amplifier that receives and amplifies said modified first signal;

a second switch having a closed condition to apply a DC voltage source to said power amplifier;

a monitor-controller that monitors the operation of said power amplifier and controls said signal modulator and said first and second switches in accordance therewith; and a detector that detects the output power of said amplifier and provides a second peak power signal representative of the peak power value of said output signal, a comparator that compares said second peak power signal with a second reference signal and provides a second fault signal in accordance therewith, said monitor-controller responds to said second fault signal and controls said amplifier in accordance therewith.

65. A power amplifier system for use in amplifying an RF input signal comprising:

a signal modulator which receives and modifies an input signal and provides therefrom a modified first signal;

a first switch having a closed condition to supply said
input signal to said modulator;

at least one power amplifier that receives and amplifies
said modified first signal;

a second switch having a closed condition to apply a DC
voltage source to said power amplifier;

a monitor-controller that monitors the operation of said
power amplifier and controls said signal modulator and
said first and second switches in accordance therewith;
and a detector that detects the reflected output power from a
load associated with said amplifier and provides a third
peak power signal representative of the peak power
level of said reflected power, a comparator that compares said third peak power signal with a third reference signal and provides a third fault signal in accordance therewith, said monitor-controller responds to
said third fault signal and controls said amplifier in
accordance therewith.

66. A power amplifier system for use in amplifying an RF
input signal comprising:

a signal modulator that receives and modifies an input
signal and provides therefrom a modified first signal;

a first switch having a closed condition to supply said
input signal to said modulator;

N power amplifiers;

a divider that receives and divides said first signal into N
signals for respective application to said N power
amplifiers to provide N amplified signals;

a second switch hiving a closed condition to apply a DC
voltage source to each of said N power amplifiers;

a combiner that receives and combines said N amplified
signals to provide therefrom an amplified output signal
for application to an output circuit; and a monitor-controller which monitors the operation of said
N power amplifiers and controls said signal modulator
and said first and second switches in accordance therewith.

67. A system as set forth in claim 66 wherein said signal
modulator varies the gain of said input signal and said
monitor-controller applies a gain control signal to said
modulator to control the gain of said input signal.

68. A system as set forth in claim 66 wherein said
modulator varies the phase of said input signal and wherein
said monitor-controller applies phase control signal to said
modulator to vary the phase of said input signal.

69. A system as set forth in claim 66 wherein said
modulator is a vector modulator that varies the phase and
gain of said input signal in response to the phase and gain
control signal.

70. A system as set forth in claim 66 including a first
power detector that detects said input signal and provides
therefrom an average input power signal representative of
the average input power thereof, and a second power detector connected to the output power thereof; and, wherein said monitor-controller includes a comparator
that compares said input and output average power
signals and controls said modulator in accordance
therewith.

71. A system as set forth in clam 66 including a detector
that detects said input signal and provides a first peak power
signal representative of the peak power level of said input
signal, a comparator that compares said first peak power
signal with a first reference signal and provides a first fault
signal in accordance therewith, said monitor-controller
responds to said first fault signal and controls said amplifier
in accordance therewith.

72. A system as set forth in claim 66 including a detector
that detects the output power of said amplifier and provides
a second peak power signal representative of the peak power
value of said output signal, a comparator that compares said
second peak power signal with a second reference signal and
provides a second fault signal in accordance therewith, said
monitor-controller responds to said second fault signal and
controls said system in accordance therewith.

73. A system as set forth in claim 66 including a detector
that detects the reflected output power from a load associated with said amplifier and provides a third peak power
signal representative of the peak power level of said
reflected power, a comparator that compares said third peak
power signal with a third reference signal and provides a
third fault signal in accordance therewith, said monitor-controller responds to said third fault signal and controls
said system in accordance therewith.

74. A power amplifier system for use in amplifying an RF
input signal comprising:

a signal modulator which receives and modifies an input
signal and provides therefrom a modified first signal;

at least one power amplifier receiving and amplifying said
modified first signal;

a monitor-controller that monitors the operation of said
power amplifier and controls said signal modulator in
accordance therewith;

a first power detector that detects said input signal and
provides therefrom an average input power signal representative of the average input power thereof, and a
second power detector connected to the output of said
amplifier for providing an output average power signal
representative of the average output power thereof;
and, wherein said monitor-controller includes a comparator
that compares said input and output average power
signals and controls said modulator in accordance
therewith.

75. A power amplifier system for use in amplifying an RF
input signal comprising:

a signal modulator which receives and modifies an input
signal and provides therefrom a modified first signal;

at least one power amplifier receiving and amplifying said
modified first signal;

a monitor-controller that monitors the operation of said
power amplifier and controls said signal modulator in
accordance therewith; and, a detector that detects said input signal and provides a first
peak power signal representative of the peak power
level of said input signal, a comparator that compares
said first peak power signal with a first reference signal
and provides a first fault signal in accordance
therewith, said monitor-controller responds to said first
fault signal to control said amplifier in accordance
therewith.

76. A system as set forth in claim 75 wherein said
monitor-controller controls said system by turning said
amplifier off in response to said first fault signal.

77. A power amplifier system for use in amplifying an RF
input signal comprising:

a signal modulator which receives and modifies an input
signal and provides therefrom a modified first signal;

at least one power amplifier receiving and amplifying said
modified first signal;

a monitor-controller that monitors the operation of said power amplifier and controls said signal modulator in accordance therewith; and, a detector that detects the output power of said amplifier and provides a second peak power signal representative of the peak power value of said output power, a comparator that compares said second peak power signal with a second reference signal and provides a second fault signal in accordance therewith, said monitor-controller responds to said second fault signal to control said system in accordance therewith.

78. A system as set forth in claim 77 wherein said monitor-controller controls said system by turning said amplifier off in response to said second fault signal.

79. A power amplifier system for use in amplifying an RF input signal comprising:

a signal modulator which receives and modifies an input signal and provides therefrom a modified first signal;

at least one power amplifier receiving and amplifying said modified first signal;

a monitor-controller that monitors the operation of said power amplifier and controls said signal modulator in accordance therewith; and, a detector that detects the reflected output power from a load associated with said amplifier and provides a third peak power signal representative of the peak power level of said reflected power, a comparator that compares said third peak power signal with a third reference signal and provides a third fault signal in accordance therewith, said monitor-controller responds to said third fault signal to control said system in accordance therewith.

80. A system as set forth in claim 79 wherein said monitor-controller controls said system by turning said amplifier off in response to said third fault signal.

81. A power amplifier system for use in amplifying an RF input signal comprising:

a signal modulator that receives and modifies an input signal and provides therefrom a modified first signal;

N power amplifiers;

a divider that receives and divides said first signal into N signals for respective application to said N power amplifiers to provide N amplified signals;

a combiner that receives and combines said N amplified signals to provide therefrom an amplified output signal for application to an output circuit;

a monitor-controller which monitors the operation of said N power amplifiers and controls said signal modulator in accordance therewith; and, said modulator is a vector modulator that varies the phase and gain of said input signal in response to phase and gain control signals.

82. A power amplifier system for use in amplifying an RF input signal comprising:

a signal modulator that receives and modifies an input signal and provides therefrom a modified first signal;

N power amplifiers;

a divider that receives and divides said first signal into N signals for respective application to said N power amplifiers to provide N amplified signals;

a combiner that receives and combines said N amplified signals to provide therefrom an amplified output signal for application to an output circuit;

a monitor-controller which monitors the operation of said N power amplifiers and controls said signal modulator in accordance therewith;

a first power detector that detects said input signal and provides therefrom an average input power signal representative of the average input power thereof, and a second power detector connected to the output of said amplifier that provides an output average power signal representative of the average output power thereof; and, wherein said monitor-controller includes a comparator that compares said input and output average power signals and controls said modulator in accordance therewith.

83. A power amplifier system for use in amplifying an RF input signal comprising:

a signal modulator that receives and modifies an input signal and provides therefrom a modified first signal;

N power amplifiers;

a divider that receives and divides said first signal into N signals for respective application to said N power amplifiers to provide N amplified signals;

a combiner that receives and combines said N amplified signals to provide therefrom an amplified output signal for application to an output circuit;

a monitor-controller which monitors the operation of said N power amplifiers and controls said signal modulator in accordance therewith; and, a detector that detects said input signal and provides a first peak power signal representative of the peak power level of said input signal and provides a first fault signal in accordance therewith, said monitor-controller responds to said first fault signal and controls said amplifier in accordance therewith.

84. A power amplifier system for use in amplifying an RF input signal comprising:

a signal modulator that receives and modifies an input signal and provides therefrom a modified first signal;

N power amplifiers;

a divider that receives and divides said first signal into N signals for respective application to said N power amplifiers to provide N amplified signals;

a combiner that receives and combines said N amplified signals to provide therefrom an amplified output signal for application to an output circuit;

a monitor-controller which monitors the operation of said N power amplifiers and controls said signal modulator in accordance therewith; and, a detector that detects the output power of said amplifier and provides a second peak power signal representative of the peak power value of said output power, a comparator that compares said second peak power signal with a second reference signal and provides a second fault signal in accordance therewith, said monitor-controller responds to said second fault signal and controls said system in accordance therewith.

85. A power amplifier system for use in amplifying an RF input signal comprising:

a signal modulator that receives and modifies an input signal and provides therefrom a modified first signal;

N power amplifiers;

a divider that receives and divides said first signal into N signals for respective application to said N power amplifiers to provide N amplified signals;

a combiner that receives and combines said N amplified signals to provide therefrom an amplified output signal for application to an output circuit;

a monitor-controller which monitors the operation of said N power amplifiers and controls said signal modulator in accordance therewith; and, a detector that detects the reflected output power from a load associated with said amplifier and provides a third peak power signal representative of the peak power level of said reflected power, a comparator that compares said third peak power signal with a third reference signal and provides a third fault signal in accordance therewith, said monitor-controller responds to said third fault signal and controls said system in accordance therewith.

* * * * *